United States Statutory Invention Registration [19]

[11] Reg. Number: H921

Wannemacher, Jr. [43] Published: May 7, 1991

[54] STRESS CONTROLLING MOUNTING STRUCTURES FOR PRINTED CIRCUIT BOARDS

[75] Inventor: Robert L. Wannemacher, Jr., Mesa, Ariz.

[73] Assignee: The United States of America as represented by the Secretary of the Army, Washington, D.C.

[21] Appl. No.: 599,768

[22] Filed: Oct. 18, 1990

[51] Int. Cl.[5] ..... H05K 7/10

[52] U.S. Cl. ..... 361/400; 361/403

*Primary Examiner*—Linda J. Wallace

*Attorney, Agent, or Firm*—Anthony T. Lane; Edward Goldberg; Michael C. Sachs

[57] ABSTRACT

A printed circuit board having a plurality of traces and pads printed thereon. Slots or openings of various geometric shapes are formed in the board to provide flexible mounting members. The pads are mounted on the mounting members. Surface-mounted electrical components have their terminals soldered to the pads. The flexibility of the mounting members permits small movements of the soldered joints in response to thermal expansions, vibrations, etc. to control potentionally damaging stresses.

20 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

STRESS CONTROLLING MOUNTING STRUCTURES FOR PRINTED CIRCUIT BOARDS

The Government has rights in this invention pursuant to Contract No. DAAK10-84-C-0079 awarded by the Department of the Army.

BACKGROUND OF THE INVENTION

1. Field of the Invention

The present invention relates to printed circuit boards and, more particularly, to mounting structures that control stresses between electrical components and conductive surfaces on printed circuit boards.

2. Description of Related Art

In the field of electronic circuit fabrication, it has been the general practice to employ printed circuit assemblies wherein much of the circuit wiring and the circuit components are mounted on a common base. In general, a printed circuit usually comprises a relatively rigid base on which a pattern of printed wires is formed in some predetermined configuration. The printed wiring is usually etched from a previously deposited layer of copper cladding. The printed wiring generally includes narrow conductive strips called "circuit traces" and broad conductive surfaces called "pads". The traces and pads provide point-to-point electrical connections for the separately manufactured electrical components, such as resistors, capacitors, transistors, etc. The components are usually mounted on the pads by soldering or other process to produce a conductive contact between the component's terminals and the pads.

Modern-day circuit fabricators often prefer to use printed circuit boards to other structures because of the neatness and miniaturization made possible by their use. There are additional benefits to be realized from the use of circuit boards: Low lead inductance, improved physical stability of the components and interconnecting leads, and good repeatability of the basic layout of a given circuit. The repeatability factor makes the use of circuit boards ideal for mass production techniques.

There are a number of alternative construction techniques that are employed for mounting the components on the circuit boards. One simple method is to use leaded components. In this method, the component's leads are first bent into an appropriate shape and the component is then mounted on the board by soldering the bent leads to spaced pads on the board. The lead-pad interconnection provides some mechanical stability in addition to the necessary electrical coupling of the component to the printed circuit.

Another mounting method, an important space-saving technique, involves the use of surface-mounted components. These components, often referred to as chips, are used widely in UHF and microwave circuits. The surface-mounted components are usually small blocks having conductive surfaces at either end that act as terminals. When used on printed circuit boards, the conductive surfaces are soldered directly to the pads.

Although the various mounting alternatives have served the purpose, they have not proved entirely satisfactory under all conditions of service for the reason that considerable difficulty with component mounting has been experienced. Specifically, circuit failures occur frequently due to stress-induced fractures that develop at the soldered interconnections between the components and the pads. Leaded components and adhesive bonding are the main technologies currently used for stress control of small electrical components to avoid such failures. However, leaded components do not lend themselves to dense packaging or very high production rates. They are also more expensive than surface-mounted devices. Adhesive bonding is not an attractive high-rate process, is a secondary operation adding recurring costs and is limited by the adhesive properties.

As such, cost and competition are driving the electronics industry to surface mount components so as to more densely pack the components into a smaller space. Also, low-cost circuit boards fabricated from plastic materials by injection molding are now being adopted by the electronics industry to lower costs. Those skilled in these arts recognize that one of the most critical problem confronting designers of such circuits is achieving sufficient physical stability of the component interconnections on the boards to avoid stress-induced failures due to such causes as thermal expansions, vibrational fatigue, and the like.

It is, therefore, a primary object of the present invention to control stresses induced between printed circuit boards and the components mounted thereon.

SUMMARY OF THE INVENTION

The general purpose of this invention is to provide a printed circuit board which embraces all of the advantages of similarly employed circuit boards and possesses none of the problems associated with thermal and fatigue incompatability between the components and the board. To attain this, the present invention contemplates a circuit board having means for controlling stresses induced between the board and components mounted thereon. In the present invention, stresses are controlled by molding or cutting geometric forms to provide flexible mounting members on which the susceptible components are mounted. The flexibility of the mounting members on the board then sustains the stresses and not the components. The stress-controlling structures are most cost effective when applied to the relatively new technology of molded printed circuit boards, but may be used with all types of boards and components.

In more detail, the invention comprises a printed circuit assembly that includes a board, a plurality of conductors mounted on the surface of the board, first and second spaced conductive surfaces on which electrical components are mounted and at least one of the surfaces mounted on a mounting member flexibly joined to the board.

The exact nature of this invention as well as other objects and advantages thereof will be readily apparent from consideration of the following specification relating to the annexed drawing.

DETAILED DESCRIPTION OF THE PREFERRED EMBODIMENTS

Figure 1:
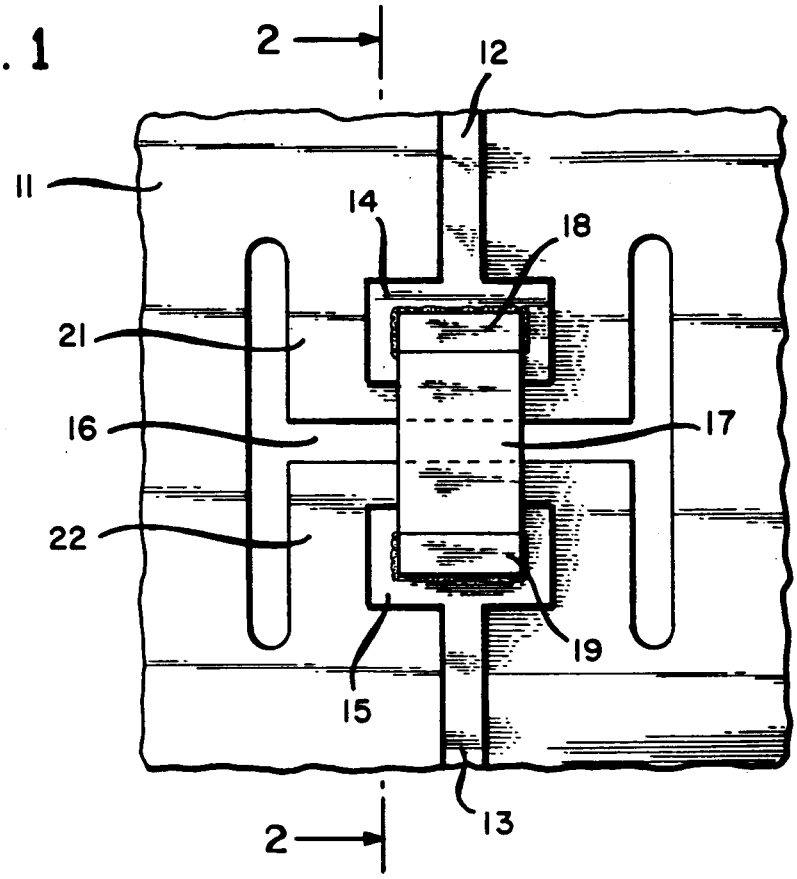
FIG. 1 is a plan view of a preferred embodiment of the invention.
Figure 2:
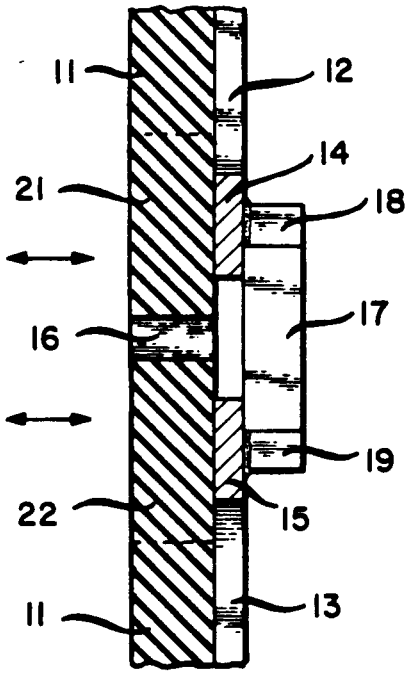
FIG. 2 is a sectional view taken on the line 2—2 of FIG. 1.

Referring now to the drawings, wherein like reference characters designate like or corresponding parts throughout the several views, there is shown in FIGS. 1 and 2 a section of a printed circuit board 11 having an upper trace 12 and a lower trace 13. Trace 12 is connected to a pad 14. Trace 13 is connected to a pad 15. Traces 12, 13 and pads 14, 15 may be formed in the conventional manner by etching of a copper clad surface on the board 11.

An H-shaped slot 16 in the board 11 forms two cantilever beams 21 and 22 on which the pads 14 and 15 are mounted. An electronic component 17, having conductive terminals 18 and 19, is mounted directly to the pads 14, 15 by soldering terminals 18, 19 to pads 14, 15, respectively.

The slot 16 may be readily formed during the molding process or it may be cut at a later time before or after the etching process. The size and shape of the beams 21, 22, and their material characteristic will primarily determine their degree of flexibility. It is noted that the beams 21, 22 will usually be of the same thickness as board 11, but they may be of a different thickness to produce a particular amount of flexibility. Those skilled in these arts may readily determine the appropriate dimensions for the beams 21, 22 to produce a desired flexibility. Of course, beams 21, 22 may each be of the same or a different size. For some situations one of the beams, say beam 21, may be eliminated.

Figure 3:
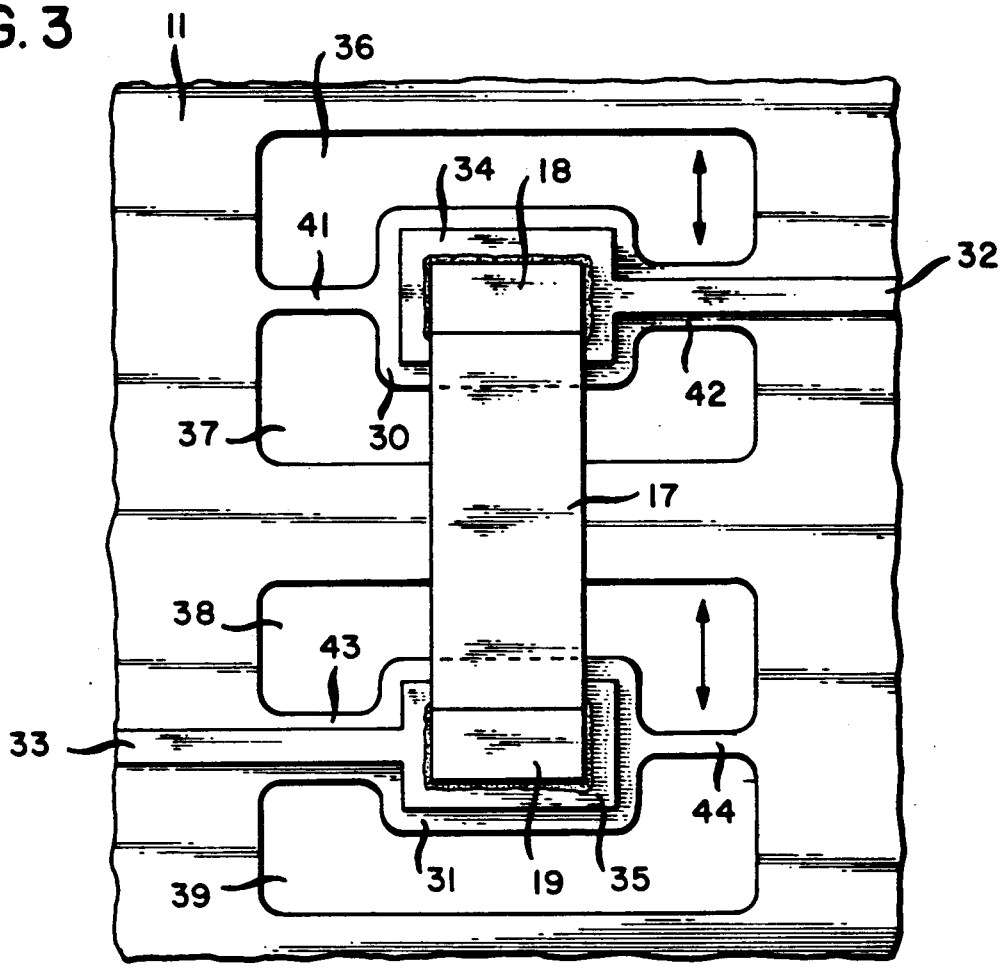
FIG. 3 is a plan view of another embodiment of the invention.

The beams 21, 22 generally provide flexibility in a direction perpendicular to the board 11 as indicated by the arrows in FIG. 2. In contrast, the embodiment of FIG. 3 provides flexibility in the plane of the board 11, generally in the direction of the arrows shown in FIG. 3. In the FIG. 3 embodiment, four U-shaped slots 36, 37, 38, 39, formed in board 11, define two broad surfaces 30, 31, each joined to the main body of board 11 by pairs of flexible, narrow arms 41, 42 and 43, 44, respectively. The electronic component 17 is mounted on the board 11 by soldering the conductive terminals 18, 19 directly to soldering pads 34, 35, mounted on the surfaces 30, 31, respectively. A circuit trace 32 is joined to pad 34 and extends to the main body of board 11 via arm 42. A circuit trace 33 is joined to pad 35 and extends to the main body of board 11 via arm 43.

The size and shape of the U-shaped slots 36–39 may be chosen by the fabricator to provide an appropriate amount of flexibility as required. In general, the narrow arms 41–44 will have sufficient flexibility so that the surfaces 30, 31 can move with respect to each other to relieve any stresses caused by thermal expansions and contractions, mechanical vibrations and the like. As in the embodiment of FIGS. 1 and 2, the material properties of the circuit board 11 must be considered when choosing the sizes and shapes of the slots 36–39.

Figure 4:
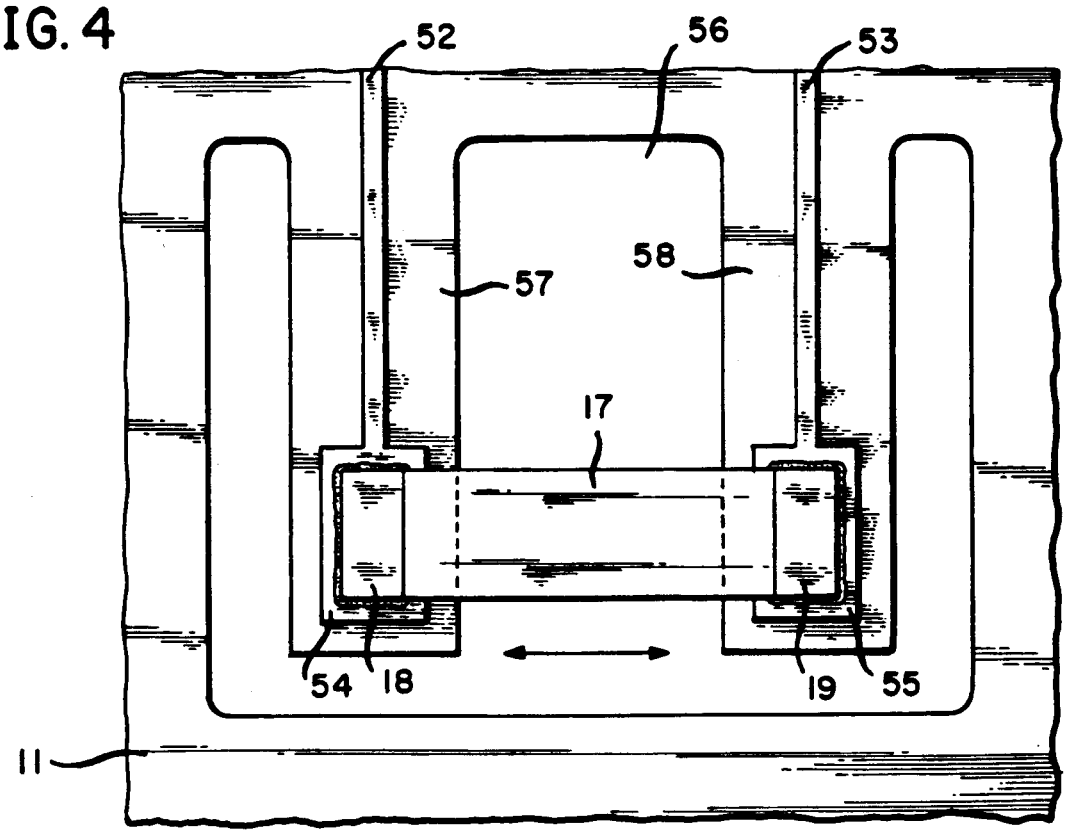
FIG. 4 is a plan view of a further alternate embodiment of the invention.

FIG. 4 shows still another configuration that will control stresses directed both perpendicular to and parallel to the plane of the board 11. The board 11 has a W-shaped slot 56 which forms a pair of elongated cantilever beams 57 and 58. A soldering pad 54 is mounted near the free end of beam 54 while a soldering pad 55 is mounted near the free end of beam 58. The electronic component 17 has its conductive terminals 18, 19 soldered directly to the pads 54, 55, respectively. Circuit traces 52, 53 extend from the main body of board 11 along the surface of beams 57, 58 to join pads 54, 55, respectively.

Because of the narrow profile of the beams 57, 58, they will move with respect to each other and with respect to the main body of board 11 in the plane of the board 11 as well as in a direction perpendicular to the plane of board 11. Of course, the beams 57, 58 will undergo resultant displacements in directions that are the vector sum of the displacements just described.

To summarize, the various embodiments of FIGS. 1–4 illustrate techniques for controlling stresses by providing flexible mounting structures capable of movements with respect to each other and with respect to the main body of a relatively rigid circuit board 11. As such, when properly designed to produce the necessary flexibility, these mounting structures can protect against failures due to thermal expansions and contractions, shock-wave vibrations, steady-state vibrations, and other stress-inducing forces. It is noted that the composite structures made up of a component 17 and its associated mounting structure will have a natural vibrating frequency. As such, the circuit board designer may design the mounting structure to effectively tune this natural frequency to a desired value. For example, the natural frequency may be tuned to produce a critical mismatch between it and some mechanical, stress-inducing vibration that may be expected to appear in the board 11. As such the mechanical vibrations will be damped due to the mismatch thereby protecting the soldered joints.

Figure 5:
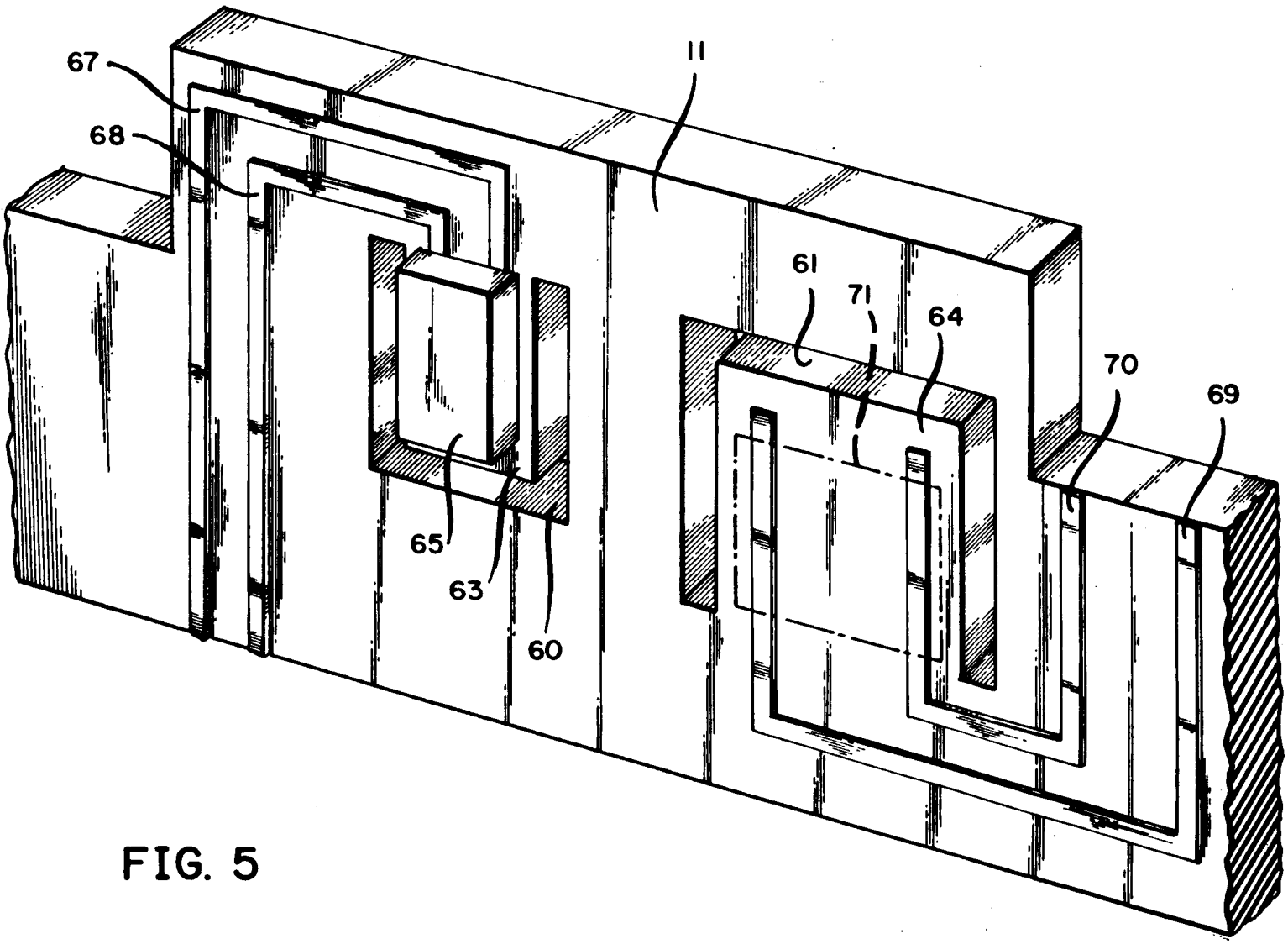
FIG. 5 is a pictoral view of still another alternate embodiment of the invention.

In many cases it may be necessary to mount a sensitive electronic component on a single surface. For example, a crystal resonator in some cases must be mounted on a common surface having a pair of conductors that are electrically coupled to a extended surfaces of the crystal. FIG. 5 depicts such a situation.

In FIG. 5, the circuit board 11 includes a pair of U-shaped slots 60, 61 that form a pair of cantilever beams 63, 64. A quartz crystal 65 is mounted on the beam 63. A pair of circuit traces 67, 68, printed on the board 11, extend onto the beam 63 to provide a conductive surface onto which the crystal 65 is connected. A second pair of circuit traces 69, 70 are shown mounted on the surface of board 11. Traces 69, 70 extend onto the beam 64 to provide conductive surfaces onto which an electrical component 71 (shown in phantom) may be mounted.

As indicated earlier, the structures shown in FIG. 5 can be designed or tuned to damp out potential vibrations. In accordance with principles well known to those skilled in these arts, the material characteristics of the board 11, the size and shape of the beams 63, 64, as well as the weight, size and placement of the crystal 65 on the beam 63 are all factors that may be controlled to produce a desired natural frequency for the composite structure.

The geometric features of the various mounting structures shown in FIGS. 1–5 may be readily added to the tool used for molding the printed circuit boards 11. In other words, the boards 11 may be molded with the appropriately shaped and sized openings 16, 36–39, 56, 60 and 61. When molding techniques are used to produce the boards 11, the addition of these mounting features will be nonrecurring once the design of the product is fixed. Of course, the addition of such mounting features to standard printed circuit boards, after the boards are formed, by punching or cutting, for example, will also have the same mechanical benefits; however, the cost advantages will usually not be as significant.

Various other modifications and similar embodiments are contemplated and may obviously be resorted to by those skilled in the art without departing from the spirit and scope of the invention, as hereinafter defined by the appended claims, as only preferred embodiments thereof have been disclosed.

The foregoing disclosure and drawings are merely illustrative of the principles of this invention and are not to be interpreted in a limiting sense. It is to be understood that the invention should not be limited to the exact details of construction shown and described because obvious modifications will occur to a person skilled in the art.

What is claimed is:

1. A printed circuit assembly comprising:
a board;
at least one mounting member flexibly attached to said board;
a pattern of printed wires mounted on the surface of the board;
first and second spaced conductive surfaces connected to said wires and at least one of which is mounted on said mounting member; and
an electronic component fixed to each of said conductive surfaces.

2. The circuit board of claim 1 wherein said mounting member is at least partially surrounded by an opening formed in said board.

3. The circuit board of claim 2 wherein said board has a flat, planar body and said mounting member lies in the plane of said body.

4. The circuit board of claim 3 wherein said mounting member and said board are formed of a common material.

5. The circuit board of claim 4 wherein said component is mounted on said board.

6. The circuit board of claim 4 wherein said member is formed as a cantilevered beam flexibly attached to said board.

7. The circuit board of claim 4 wherein said member is formed as a broad surface with at least two narrow flexible arms extending between said broad surface and said body.

8. The circuit board of claim 6 wherein said cantilevered beam is flexibly mounted for movement in the plane of said board and in a direction transverse to the plane of said board.

9. The circuit board of claim 6 wherein said first and second spaced conductive surfaces are mounted on said at least one mounting member.

10. A printed circuit assembly comprising:
a board;
first and second mounting members, each flexibly attached to said board;
a pattern of printed wires mounted on the board;
first and second conductive surfaces connected to said wires and each surface mounted on a different one of said members; and
an electronic component having terminals each fixed to one of said surfaces.

11. The circuit board of claim 10 wherein each said member is at least partially surrounded by an opening in said board.

12. The circuit board of claim 11 wherein said board has a flat, planar body and said mounting members lie in the plane of said body.

13. The circuit board of claim 12 wherein said mounting members and said board are formed of a common material.

14. The circuit board of claim 13 wherein said members are formed as cantilevered beams flexibly attached to said board.

15. The circuit board of claim 14 wherein said members each include a broad surface with two flexible arms extending between said broad surface and said body.

16. The circuit board of claim 14 wherein said beams are flexibly mounted for movement in the plane of said board and in a direction transverse to the plane of said board.

17. The circuit board of claim 14 wherein said opening is an H-shaped slot formed in said board that surrounds the free edges of each of said cantilevered beams.

18. The circuit board of claim 15 wherein said opening includes a pair of U-shaped slots fored in said board.

19. The circuit board of claim 16 wherein said opening is a W-shaped slot formed in said board.

20. The circuit board of claim 12 wherein said component is surface mounted on said body.

* * * * *